United States Patent
Zhong et al.

(10) Patent No.: US 12,004,418 B2
(45) Date of Patent: Jun. 4, 2024

(54) LUMINESCENT FILM, PREPARATION METHOD THEREOF, AND ELECTROLUMINESCENT DEVICE

(71) Applicant: BOE Technology Group Co., Ltd., Beijing (CN)

(72) Inventors: Haizheng Zhong, Beijing (CN); Dengbao Han, Beijing (CN); Chenhui Wang, Beijing (CN); Shuai Chang, Beijing (CN); Yang Liu, Beijing (CN); Xiang Miao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 469 days.

(21) Appl. No.: 17/432,445

(22) PCT Filed: Feb. 3, 2021

(86) PCT No.: PCT/CN2021/075110
§ 371 (c)(1),
(2) Date: Aug. 19, 2021

(87) PCT Pub. No.: WO2021/190169
PCT Pub. Date: Sep. 30, 2021

(65) Prior Publication Data
US 2023/0142678 A1    May 11, 2023

(30) Foreign Application Priority Data
Mar. 23, 2020 (CN) .......................... 202010210035.3

(51) Int. Cl.
*H10K 85/50* (2023.01)
*C09K 11/06* (2006.01)
(Continued)

(52) U.S. Cl.
CPC .............. *H10K 85/50* (2023.02); *C09K 11/06* (2013.01); *H10K 71/10* (2023.02); *C09K 2211/188* (2013.01); *H10K 50/11* (2023.02)

(58) Field of Classification Search
CPC ........ H10K 85/50; H10K 71/10; H10K 50/11; C09K 11/06; C09K 2211/188
See application file for complete search history.

(56) References Cited

U.S. PATENT DOCUMENTS

2021/0143356 A1*   5/2021   Zhang ................. H10K 50/115

FOREIGN PATENT DOCUMENTS

CN       110120457 A       8/2019

OTHER PUBLICATIONS

Sadhanala et al.; "Blue-Green Color Tunable Solution Processable Organolead Chloride-Bromide Mixed Halide Perovskites for Optoelectronic Applications"; Nano Letters 2015, 15, 6095-6101. (Year: 2015).*

(Continued)

*Primary Examiner* — Syed I Gheyas
(74) *Attorney, Agent, or Firm* — IPro, PLLC

(57) ABSTRACT

The disclosure relates to the technical field of display, in particular to a luminescent film, a preparation method thereof, and an electroluminescent device. The luminescent film comprises: a crystallized blue-light perovskite material, and halogenated amine ligand materials grafted on the crystallized blue-light perovskite material, wherein the crystallized blue-light perovskite material comprises 3D perovskite nano-crystals; and the halogenated amine ligand materials comprise a first halogenated amine ligand material and a second halogenated amine ligand material, and the first halogenated amine ligand material is different from the (Continued)

second halogenated amine ligand material. The disclosure is suitable for manufacturing luminescent films and electroluminescent devices.

20 Claims, 3 Drawing Sheets

(51) Int. Cl.
*H10K 71/10* (2023.01)
*H10K 50/11* (2023.01)

(56) References Cited

OTHER PUBLICATIONS

Xu et al.; "Ligand-Mediated Release of Halides for Color Tuning of Perovskite Nanocrystals with Enhanced Stability"; J. Phys. Chem. 2019, 10, 5836-5840. (Year: 2019).*
CN202010210035.3 first office action and search report.

* cited by examiner

LUMINESCENT FILM, PREPARATION METHOD THEREOF, AND ELECTROLUMINESCENT DEVICE

The disclosure claims priority to Chinese Patent Application No. 202010210035.3, entitled "LUMINESCENT FILM, PREPARATION METHOD THEREOF, AND ELECTROLUMINESCENT DEVICE", filed with the China National Intellectual Property Administration on Mar. 23, 2020, which is incorporated herein by reference in its entirety.

TECHNICAL FIELD

The disclosure relates to the technical field of display, in particular to a luminescent film, a preparation method thereof, and an electroluminescent device.

BACKGROUND

Recently, perovskite materials have become a research trend particularly in the application field of electroluminescent devices because of their good photoelectric performance. Up to now, the external quantum efficiency in the near-infrared band (~730 nm) and the green-light band (~525 nm) of perovskite electroluminescent devices prepared from perovskite luminescent materials has been over 20%, which is close to the level of present commercial organic electroluminescent devices. However, the performance of devices corresponding to the blue-light band, which is indispensable for realizing high-quality full-color display and illumination and is one of the three primary colors, is far behind that of red-light and green-light devices mainly for the reason that high-quality blue-light perovskite luminescent films suitable for preparing electroluminescent devices are not available.

At present, blue-light perovskite luminescent films in electroluminescent devices are prepared mainly by two approaches. According to one approach, blue-light perovskite quantum dot materials are prepared by a solution method and are then dispersed in a solvent to prepare a spin-coating solution, and finally, blue-light perovskite luminescent films are prepared by a spin-coating process.

According to the other approach, blue-light perovskite luminescent films are directly formed in situ on a substrate by a spin-coating method.

SUMMARY

The embodiments of the disclosure provide a luminescent film, a preparation method, and an electroluminescent device.

In order to achieve the above purpose, the embodiments of the disclosure adopt the following technical solution:

in a first aspect, the disclosure provides a luminescent film, comprising: a crystallized blue-light perovskite material, and halogenated amine ligand materials grafted on the crystallized blue-light perovskite material;

wherein, the crystallized blue-light perovskite material comprises 3D perovskite nano-crystals; and the halogenated amine ligand materials comprise: a first halogenated amine ligand material and a second halogenated amine ligand material, and the first halogenated amine ligand material is different from the second halogenated amine ligand material.

Optionally, the first halogenated amine ligand material and the second halogenated amine ligand material are grafted on the crystallized blue-light perovskite material.

Optionally, the 3D perovskite nano-crystals have a particle size of 10 nm-20 nm.

Optionally, the blue-light perovskite material comprises a perovskite material with a molecular structure $ABX_3$, wherein A comprises any one or more of an organic amine group, formamidine and cesium ions, B comprises lead ions, and X comprises a combination of chlorine and bromine.

Optionally, the organic amine group comprises methylamine, ethylamine, or propylamine.

Optionally, the first halogenated amine ligand material is a brominated amine ligand material, and the second halogenated amine ligand material is an aromatic halogenated amine material.

Optionally, the brominated amine ligand material comprises any one of brominated 3,3-diphenyl propylamine, brominated ethylamine, brominated butylamine and brominated octylamine.

Optionally, the aromatic halogenated amine material comprises any one of phenylethyl amine bromide, benzyl amine bromide, P-fluorophenyl amine bromide, O-fluorophenyl amine bromide and M-fluorophenyl amine bromide.

In a second aspect, a preparation method of the above luminescent film is provided, comprising:
  dissolving a first blue-light perovskite reaction material, a first halogenated amine ligand material and a second halogenated amine ligand material in a first solvent to form a first precursor solution;
  dissolving a second blue-light perovskite reaction material in a second solvent to form a second precursor solution;
  stirring the first precursor solution and the second precursor solution, and mixing the two after stirring to form a blue-light perovskite precursor solution;
  forming the blue-light perovskite precursor solution on a substrate by a spin-coating process; and
  dropwise adding an anti-solvent to the blue-light perovskite precursor solution formed on the substrate within a preset time to crystallize a blue-light perovskite material, and grafting the first halogenated amine ligand material and the second halogenated amine ligand material on the crystallized blue-light perovskite material to form a blue-light luminescent film.

Optionally, the first blue-light perovskite reaction material comprises any one or more of an organic amine group, formamidine and cesium ions, and the second blue-light perovskite reaction material comprises lead ions.

Optionally, the first blue-light perovskite reaction material comprises cesium chloride, and the second blue-light perovskite reaction material comprises lead bromide.

Optionally, the first halogenated amine ligand material is a brominated amine ligand material, and the second halogenated amine ligand material is an aromatic halogenated amine material.

Optionally, the first halogenated amine ligand material comprises brominated 3,3-diphenylpropyl amine, the second halogenated amine ligand material comprises phenethyl amine bromide.

Optionally, the molar ratio of the brominated 3,3-diphenylpropyl amine to the phenethyl amine bromide is 4:4.

Optionally, the first solvent and the second solvent comprise dimethyl sulfoxide.

Optionally, the anti-solvent comprises any one of methylbenzene, chloroform, chlorobenzene, acetone and ethyl acetate.

In a third aspect, an electroluminescent device is provided, comprising an anode, a cathode, and a luminescent layer located between the anode and the cathode, wherein the luminescent layer comprises the above luminescent film.

Optionally, further comprising a substrate disposed below the anode, a hole injection layer and a hole transporting layer disposed between the anode and the luminescent layer, and an electron injection layer and an electron transporting layer disposed between the cathode and the luminescent layer.

Optionally, a preparation method of the electroluminescent device comprises:
- wiping and ultrasonically cleaning the substrate sequentially with deionized water, an acetone solution, an ethanol solution and an isopropanol solution, drying the substrate with nitrogen for use, and pre-processing the cleaned substrate with oxygen plasma to clean a surface of the substrate and improve the wettability of the surface of the substrate;
- forming the anode on the substrate;
- sequentially forming the hole injection layer and the hole transporting layer on the anode;
- forming the luminescent layer on the hole transporting layer;
- transferring the substrate into a vacuum cavity, and sequentially forming the electron transporting layer and the electron injection layer;
- forming the cathode on the electron injection layer; and
- transferring the substrate into a glove box for packaging to form the electroluminescent device.

In a fourth aspect, a displaying device is provided, comprising the above electroluminescent device.

The aforesaid description is merely a brief summary of the technical solution of the disclosure. To allow those skilled in the art to gain a better understanding of the technical means of the disclosure to implement the disclosure according to the contents in the specification and to make the above and other purposes, features and advantages of the disclosure clearer, specific implementations of the disclosure are given below.

BRIEF DESCRIPTION OF THE DRAWINGS

To more clearly explain the technical solutions of the embodiments of the disclosure or related arts, drawings for describing the embodiments of the disclosure or the related arts will be briefly introduced below. Obviously, the drawings in the following description only illustrate some embodiments of the disclosure, and those ordinarily skilled in the art can obtain other drawings according to the following ones without creative labor.

DETAILED DESCRIPTION

Figure 1:
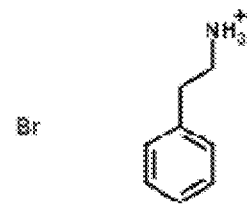
FIG. 1 is a diagram of the molecular structure of phenethyl amine bromide according to one embodiment of the disclosure.

The technical solutions of the embodiments of the disclosure will be clearly and completely described below in conjunction with the drawings of the embodiments of the disclosure. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

In the embodiments of the disclosure, terms such as "first" and "second" are used to distinguish identical or similar elements with basically the same function and effect merely for the purposes of clearly describing the technical solutions of the embodiments of the disclosure, and should not be construed as indicating or implying relative importance or implicitly indicating the number of technical features referred to.

One embodiment of the disclosure provides a luminescent film, comprising: a crystallized blue-light perovskite material, and halogenated amine ligand materials grafted on the crystallized blue-light perovskite material.

Wherein, the crystallized blue-light perovskite material comprises 3D perovskite nano-crystals; and the halogenated amine ligand materials comprise: a first halogenated amine ligand material and a second halogenated amine ligand material, and the first halogenated amine ligand material is different from the second halogenated amine ligand material.

In related arts, perovskite nano-crystals of a quasi-2D structure typically comprise 1-2 layers, while the 3D perovskite nano-crystals comprise three or more layers. Based on the size effect of semiconductor nano-crystalline materials, the size of the 3D perovskite nano-crystals is reduced by adding the two ligand materials, thus realizing blue-light emission.

In the luminescent film, two different halogenated amine ligand materials are grafted on the crystallized blue-light perovskite material, so that the crystal structure of the perovskite nano-crystals is effectively controlled to turn an original quasi-2D structure into a 3D perovskite nano-crystal structure, the growth of the perovskite nano-crystals can be forcefully retrained to effectively reduce the size of blue-light perovskite nano-crystals, and surface defects of the blue-light perovskite nano-crystals can be effectively passivated to avoid obvious hole defects to ensure that the surface of the film is smooth and uniform. In this way, the luminescent film is able to emit pure blue light suitable for high-quality display, the center of a blue-light emitting peak is 465 nm-475 nm, and the half-peak width is 20 nm-30 nm; and the luminescent film has an extremely high fluorescence quantum yield (>70%) and completely meets the requirements of high-quality display.

Optionally, the first halogenated amine ligand material and the second halogenated amine ligand material are grafted on the crystallized blue-light perovskite material, such that the luminescent property of the luminescent film may be further improved.

Optionally, the particle size of the 3D perovskite nano-crystals is 10 nm-20 nm. For example, the particle size of the 3D perovskite nano-crystals may be 12 nm, 14 nm, 16 nm, 18 nm, or the like. Because the particle size of the 3D perovskite nano-crystals is small, the carrier transport capacity of the luminescent film is extremely high.

Optionally, the blue-light perovskite material comprises a perovskite material with a molecular structure $ABX_3$, wherein A comprises any one or more of an organic amine group, formamidine (FA) and cesium ions ($Cs^+$), B comprises lead ions ($Pb^+$), and X comprises a combination of chlorine (Cl) and bromine (Br). The organic amine group may be methylamine (MA), ethylamine, propylamine, or the like. The blue-light perovskite material has a simple molecular structure and is easy to prepare.

Optionally, the first halogenated amine ligand material is a brominated amine ligand material, and the second halogenated amine ligand material is an aromatic halogenated amine material.

Optionally, the brominated amine ligand material comprises any one of brominated 3,3-diphenylpropyl amine, brominated ethylamine, brominated butylamine and brominated octylamine. Considering that the brominated 3,3-diphenylpropyl amine (DPPA-Br) is able to more effectively control the crystal structure of the perovskite nano-crystals to turn an original quasi-2D structure into a 3D perovskite nano-crystal structure, the 3,3-diphenylpropyl amine is preferably used as the first halogenated amine ligand material.

Optionally, the aromatic halogenated amine material comprises: phenylethyl amine bromide, benzyl amine bromide, P-fluorophenyl amine bromide, O-fluorophenyl amine bromide and M-fluorophenyl amine bromide. Considering that the phenylethyl amine bromide (PEA-Br) is able to more effectively reduce the size of the blue-light perovskite nano-crystals, the phenylethyl amine bromide is preferably used as the second halogenated amine ligand material. The molecular structure of the phenylethyl amine bromide is shown in FIG. 1.

A preparation method of the phenylethyl amine bromide is provided below. The preparation method of the phenylethyl amine bromide comprises: a certain amount of phenylethyl amine (PEA) is mixed with ethyl alcohol according to a volume ratio of 1:1, a mixture is cooled to 0° C. by an ice-water bath, and then a slightly excessive amount of a hydrobromic acid (HBr) aqueous solution is dropwise added to the mixture for a reaction for two hours; when the reaction is finished, the mixed solution is rotatably evaporated to be dried, is then re-crystallized with ethyl alcohol, and is finally washed with anhydrous ether three times and vacuum-dried at 50° C. for 12 hours to obtain white phenylethyl amine bromide powder.

A preparation method of the benzyl amine bromide, the P-fluorophenyl amine bromide, the O-fluorophenyl amine bromide and the M-fluorophenyl amine bromide is the same as the preparation method of the phenylethyl amine bromide except in that the phenylethyl amine is replaced with an equal molar quantity of benzyl amine, P-fluorophenyl amine, O-fluorophenyl amine and M-fluorophenyl amine.

One embodiment of the disclosure provides a preparation method of the luminescent film in the above embodiment. The preparation method comprises:

S01: a first blue-light perovskite reaction material, a first halogenated amine ligand material and a second halogenated amine ligand material are dissolved in a first solvent to form a first precursor solution.

Wherein, the molar ratio of the first blue-light perovskite reaction material, the first halogenated amine ligand material and the second halogenated amine ligand material depends on materials actually used, and the disclosure has no specific limitation in this aspect.

S02: a second blue-light perovskite reaction material is dissolved in a second solvent to form a second precursor solution, wherein the first blue-light perovskite reaction material and the second blue-light perovskite reaction material are subjected to a chemical reaction to form a blue-light perovskite material.

S03: the first precursor solution and the second precursor solution are stirred and are then mixed to form a blue-light perovskite precursor solution.

The stirring time may be 10-13 hours, and considering of the stirring effect and the preparation cost, the stirring time is 12 hours preferably. It should be noted that the first precursor solution and the second precursor solution may be stirred again for 1-3 hours, such as 2 hours, after being mixed, so as to be evenly mixed.

S04: the blue-light perovskite precursor solution is formed on a substrate by a spin-coating process.

The substrate may be made of glass, ITO (Indium Tin Oxide), silver nano-wires, or the like. Before being used, the substrate may be wiped and ultrasonically cleaned sequentially with deionized water, an acetone solution, an ethanol solution and an isopropanol solution, and is then dried with nitrogen for use; after that, the cleaned substrate is pre-processed with oxygen plasma to clean the surface of the substrate and improve the wettability of the surface.

S05: an anti-solvent is dropwise added to the blue-light perovskite precursor solution formed on the substrate within a preset time to crystallize the blue-light perovskite material, and the first halogenated amine ligand material and the second halogenated amine ligand material are grafted on the crystallized blue-light perovskite material to form the blue-light luminescent film. Here, the preset time refers to a time period after spin-coating is started. For example, the preset time may be a time period from 18 s to 22 s after spin-coating is started.

The preparation method of the blue-light luminescent film is a one-step process (also referred to as an in-situ reprecipitation process), that is, the blue-light luminescent film is prepared by directly spin-coating the substrate with the perovskite precursor solution including different components. During the "one-step" process, the anti-solvent needs to be dropwise added to control the crystallization process of the perovskite material to obtain the blue-light perovskite luminescent film with a smooth, uniform and compact surface.

The first solvent is the same as or different from the second solvent. To simplify the preparation process, the former is preferred. The anti-solvent, the first solution and the second solvent are mutually soluble.

It should be noted that the blue-light perovskite precursor solution contains raw material for forming a perovskite film, and the raw materials chemically react with each other on the substrate during the spin-coating process to form the luminescent film with a perovskite crystal structure rather than chemically reacting with each other to form a perovskite crystal structure when evenly dispersed in the solvent.

One embodiment of the disclosure provide a preparation method of a luminescent film, comprising: a first blue-light perovskite reaction material, a first halogenated amine ligand material and a second halogenated amine ligand material are dissolved in a first solvent to form a first precursor solution; a second blue-light perovskite reaction material is dissolved in a second solvent to form a second precursor solution; the first precursor solution and the second precursor solution are stirred and are then mixed to form a blue-light perovskite precursor solution; the blue-light perovskite precursor solution is formed on a substrate by a spin-coating process; and an anti-solvent is dropwise added to the blue-light perovskite precursor solution formed on the substrate within a preset time to crystallize a blue-light perovskite material, and the first halogenated amine ligand material and the second halogenated amine ligand material are grafted on the crystallized blue-light perovskite material to form a blue-light luminescent film.

The preparation method of the luminescent film is simple, and the spectrum is easy to control; moreover, the problem of poor solubility and precipitation of the first blue-light perovskite reaction material and the second blue-light perovskite reaction material are effectively solved.

Optionally, the first blue-light perovskite reaction material comprises any one or more of an organic amine group, formamidine and cesium ions; the first halogenated amine ligand material is a brominated amine ligand material, and the second halogenated amine ligand material is an aromatic halogenated amine material; and the second blue-light perovskite reaction material comprises lead ions. The organic amine group may be methylamine (MA), ethylamine, propylamine, or the like.

Optionally, the first solvent and the second solvent comprise dimethyl sulfoxide (DMSO), the first blue-light perovskite reaction material comprises cesium chloride (CsCl), the first halogenated amine ligand material comprises brominated 3,3-diphenylpropyl amine, the second halogenated amine ligand material comprises phenethyl amine bromide (PEA-Br), the second blue-light perovskite reaction material comprises lead bromide (PbBr$_2$), and the anti-solvent comprises any one of methylbenzene, chloroform, chlorobenzene, acetone and ethyl acetate.

Optionally, the molar ratio of the brominated 3,3-diphenylpropyl amine to the phenethyl amine bromide is 4:4. The luminescent film prepared with this molar ratio has a better luminescent property, the center of a light-emitting peak is 474 nm, the half-peak width is 23 nm, and corresponding color coordinates are (0.1166, 0.0954).

A specific embodiment is provided below with cesium chloride (CsCl) as the first blue-light perovskite reaction material, lead bromide (PbBr$_2$) as the second blue-light perovskite reaction material, brominated brominated 3,3-diphenylpropyl amine (DPPA-Br) as the first brominated amine ligand material, phenethyl amine bromide (PEA-Br) as the second brominated amine ligand material, and dimethyl sulfoxide (DMSO) as the first solvent and the second solvent.

The preparation method of the luminescent film comprises:

S101: CsCl, DPPA-Br and PEA-Br are dissolved in 1.5 ml of anhydrous DMSO with a molar ratio of 1.1:x:y to prepare a first precursor solution A, wherein x:y is 0:8, 2:6, 4:4, 6:2 or 8:0.

It should be noted that to better explain the properties of the luminescent film provided by this embodiment, control groups are set here. When x:y is 0:8, it indicates that only one ligand material PEA-Br is adopted; when x:y is 2:6, 4:4, or 6:2, it indicates that two ligand materials DPPA-Br and PEA-Br are adopted, and the difference lies in different proportions of the two ligand materials added; and when x:y is 8:0, it indicates that only one ligand material DPPA-Br is adopted.

S102: PbBr$_2$ is dissolved in 1 ml of anhydrous DMSO to prepare a second precursor solution B.

S103: the first precursor solution A and the second precursor solution B are stirred for 12 hours and are then mixed to prepare a blue-light perovskite precursor solution; after that, the blue-light perovskite precursor solution is stirred for 2 hours and is filtered with a 0.22 um nylon filter to obtain a final blue-light perovskite precursor solution.

It should be noted that if CsCl, DPPA-Br, PEA-Br and PbBr$_2$ are added to DMSO at the same time, the materials will not be able to be completely dissolved in the DMSO and may precipitate. By dissolving the materials into the DMSO separately, the problem of low solubility of precursor materials in DMSO may be effectively solved, and the thickness of the blue-light perovskite luminescent film may be accurately controlled.

S104: the blue-light precursor solution is dropwise added onto a substrate, and 400 ul of an anti-solvent (any one of methylbenzene, chloroform, chlorobenzene and ethyl acetate) is dropwise added within 18 s-22 s after spin-coating is started, to control the forming process of perovskite grains in the film.

S105: after spin-coating is finished, annealing is carried out at 80° C. for 5 minutes to obtain the blue-light perovskite luminescent film with high luminous efficiency.

Figure 2:
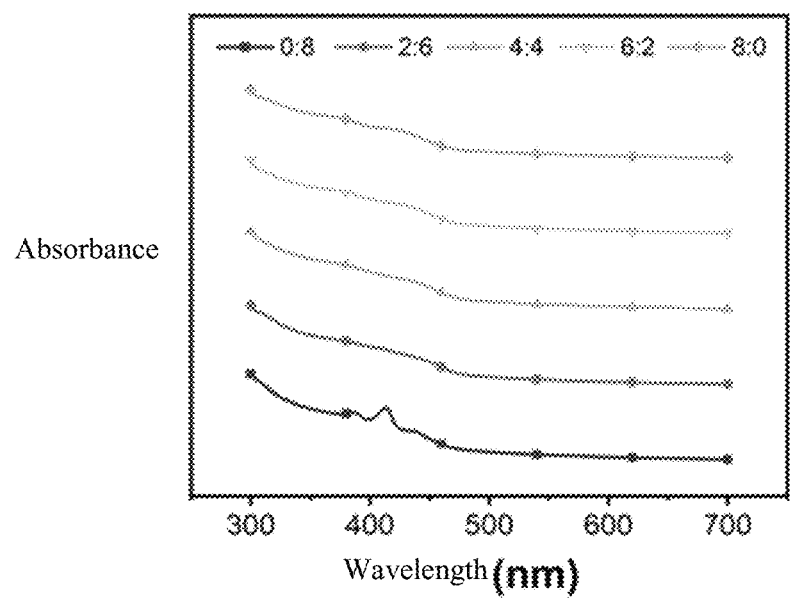
FIG. 2 illustrates the absorption spectra of a luminescent film according to one embodiment of the disclosure.

Absorption spectra of luminescent films prepared with different ligand proportions are shown in FIG. 2. For the sake of a brief description, corresponding absorption spectra obtained when x:y is 0:8, 2:6, 4:4, 6:2 and 8:0 are marked as a1, b1, c1, d1 and e1, respectively. It can be found, by a careful comparison, that when only one ligand PEA-Br is used, a1 has an obvious absorption peak at 413 nm, which proves that a large amount of perovskite of a quasi-2D structure exists in the blue-light luminescent film. When both DPPA-Br and PEA-Br are used as ligands, b1, c1 and d1 do not have an obvious absorption peak of perovskite grains of a quasi-2D structure, which proves that the blue-light perovskite film consists of nano-crystals of a 3D perovskite structure.

Figure 3A:
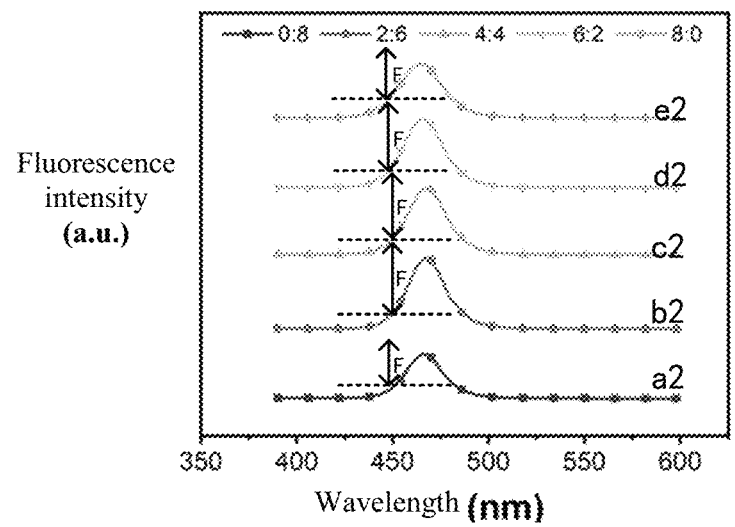
FIG. 3a illustrates the emission spectrum of a luminescent film according to one embodiment of the disclosure.
Figure 3B:
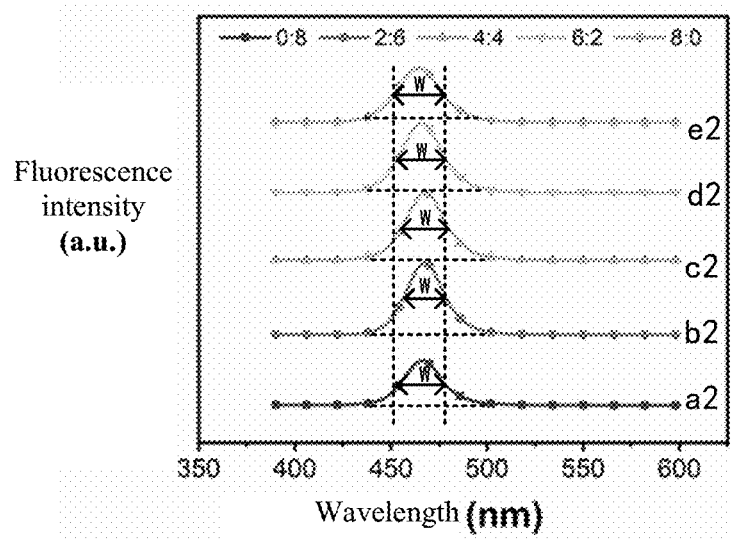
FIG. 3b illustrates the emission spectrum of another luminescent film according to one embodiment of the disclosure.

Emission spectra of the luminescent films formed with different ligand proportions are shown in FIG. 3a and FIG. 3b. For the sake of a brief description, corresponding absorption spectra obtained when x:y is 0:8, 2:6, 4:4, 6:2 and 8:0 are marked as a2, b2, c2, d2 and e2, respectively. As shown in FIG. 3a and FIG. 3b, light emitting peaks of all the luminescent films are within the blue-light band, which indicates that all the luminescent films are able to emit blue light. In addition, when two ligands DPPA-Br and PEA-Br are used, the center of the light emitting peak is 465 nm-475 nm, and the half-peak width is 20 nm-30 nm. Wherein, the center of the light emitting peak of c2 is 474 nm, the half-peak width is 23 nm, and corresponding color coordinates are (0.1166, 0.0954).

As shown in FIG. 3a, the intensity F of the light emitting peak of b2, c2 and d2 obtained when the two ligands DPPA-Br and PEA-Br are used is greater than the intensity F of the light emitting peak of a2 and e2 obtained when one ligand is used, that is, the intensity of the light emitting peak of the luminescent films adopting the two ligands DPPA-Br and PEA-Br is remarkably increased. In addition, as shown in FIG. 3b, the half-peak width of b2, c2 and d2 obtained when the two ligands DPPA-Br and PEA-Br are used is smaller than the half-peak width W of a2 and e2 obtained when one ligand is used, wherein the half-peak width W is the peak width at half of the peak height of the chromatographic peak. It can be known, in conjunction with FIG. 3a and FIG. 3b, that the intensity of the light emitting peak of the blue-light luminescent films using the two ligands DPPA-Br and PEA-Br is obviously increased, and the half-peak width is decreased, which indicates that the sizes of blue-light perovskite nano-crystals in the films are more uniform, and surface defects are further passivated.

Figure 4:
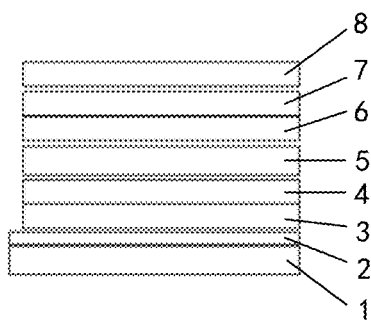
FIG. 4 is a structural diagram of an electroluminescent device according to one embodiment of the disclosure.

One embodiment of the disclosure provides an electroluminescent device. As shown in FIG. 4, the electroluminescent device comprises: an anode 2, a cathode 8, and a luminescent layer 5 located between the cathode 8 and the anode 2, wherein the luminescent layer comprises the luminescent film in the above embodiment.

Because the luminescent layer of the blue-light perovskite electroluminescent device in this embodiment adopts the blue-light perovskite luminescent film in in the above embodiment and the surface of the perovskite luminescent film is extremely smooth and uniform, the external quantum efficiency of the device is effectively improved. Particularly, by adding the second halogenated amine ligand material, the size of perovskite nano-crystals in the perovskite luminescent film is decreased, and surface defects of the nano-crystals are effectively passivated. Excitons (electron hole pairs) generated when the electroluminescent device works may be effectively confined in the perovskite nano-crystals, and non-radiative recombination caused by surface defects is greatly restrained, such that the blue-light perovskite electroluminescent device has extremely high external quantum efficiency.

The electroluminescent device has extremely high external quantum efficiency, overcomes the defects of perovskite luminescent materials in the blue-light band, and greatly promotes the application of the perovskite luminescent materials in the display field.

As shown in FIG. 4, the electroluminescent device may further comprise: a substrate 1 disposed below the anode 2, a hole injection layer 3 and a hole transporting layer 4 disposed between the anode 2 and the luminescent layer 5, and an electron injection layer 7 and an electron transporting layer 6 disposed between the cathode 8 and the luminescent layer 5.

One embodiment of the disclosure provides a preparation method of the electroluminescent device in the above embodiment. The preparation method comprises: an anode, a cathode, and a luminescent layer between the anode and the cathode are formed, wherein the luminescent layer comprises a luminescent film which is prepared through the above preparation method of a luminescent film. The preparation method is simple in process, high in operability and low in cost.

The electroluminescent device formed by the preparation method has high external quantum efficiency, overcomes the defects of perovskite luminescent materials in the blue-light band, and greatly promotes the application of the perovskite luminescent materials in the display field.

The preparation method of the electroluminescent device, shown in FIG. 4, will be described below by way of example. The preparation method comprises:

S201: a substrate 1 is wiped and ultrasonically cleaned sequentially with deionized water, an acetone solution, an ethanol solution and an isopropanol solution, and is then dried with nitrogen for use; after that, the cleaned substrate 1 is pre-processed with oxygen plasma to clean the surface of the substrate and improve the wettability of the surface of the substrate.

The substrate may be a rigid substrate or a flexible substrate, and may be made of transparent glass, ITO, silver nano-wires, or the like.

S202: an anode 2 is formed on the substrate 1 processed in S201.

The anode, as a connecting layer of the forward voltage of the perovskite electroluminescent device, has good electrical conductivity and visible light transparency as well as a high work function value, and is generally made of an inorganic metallic oxide (such as ITO, ZnO), or a metallic material with a high work function value (such as gold, copper, silver and platinum).

S203: a hole injection layer 3 and a hole transporting layer 4 are sequentially formed on the anode 2.

The hole injection layer may be made of an organic conducting polymer such as PEDOT:PSS. The hole transporting layer may be made of TFB, Poly-TPD, CBP, PVK, and the like.

Specifically, the anode 2 is coated with PEDOT:PSS and Poly-TPD by a spin-coating process and is then annealed, then the surface of a Poly-TPD film is processed with oxygen plasma to form the hole injection layer 4 and the hole transporting layer 5, and after that, the substrate 1 provided with the anode 2, the hole injection layer 3 and the hole transporting layer 4 is transferred into a nitrogen glove box.

S204: a luminescent layer 5 is formed on the hole transporting layer 4, wherein the luminescent layer 5 is a blue-light luminescent film. Here, the blue-light luminescent film prepared from 3D perovskite nano-crystals formed in situ on the hole transporting layer in the above embodiment and having a high fluorescence quantum yield may be adopted. The specific preparation method may be understood with reference to the above embodiment, and will no longer be detailed here.

S205: after S204 is finished, the substrate 1 is transferred into a vacuum cavity, and an electron injection layer 7 and an electron transporting layer 6 are sequentially formed.

Specifically, the electron transporting layer and the electron injection layer are formed by a vacuum vapor deposition process, wherein the air pressure of a vapor deposition chamber is less than $2*10^{-4}$ Pa, the vapor deposition rates of the electron transporting layer and the electron injection layer are 1 Å/s and 0.1 Å/s, respectively; the thickness of the electron transporting layer may be 30 nm, and the thickness of the electron injection layer may be 1 nm.

Wherein, the electron transporting layer may be made of TPBi, TmPyPB, B3PYMPM, B3PyPB, or the like. The electron injection layer may be made of LiF or $CsCO_3$.

S206: a cathode 8 is formed on the electron injection layer 7.

Specifically, the cathode is formed by a vapor deposition process, wherein the vapor deposition pressure is $2*10^{-4}$ Pa, the vapor deposition rate is 5 Å/s, and the thickness of the cathode may be 100 nm. The cathode has a good electrical conductivity and a low work function value, and is generally made of a metallic material with a low work function value such as lithium, magnesium, calcium, strontium, aluminum, or indium; or, the metallic material with a low work function value is copper, gold or silver.

S207: after S206 is finished, the substrate is transferred into a glove box to be packaged to form a blue-light perovskite electroluminescent device.

It should be noted that the glove box is under an inert gas atmosphere. In this embodiment, the glove box is under a nitrogen atmosphere.

5208: the photoelectric property of the prepared perovskite blue-electroluminescent device is tested.

Figure 5:
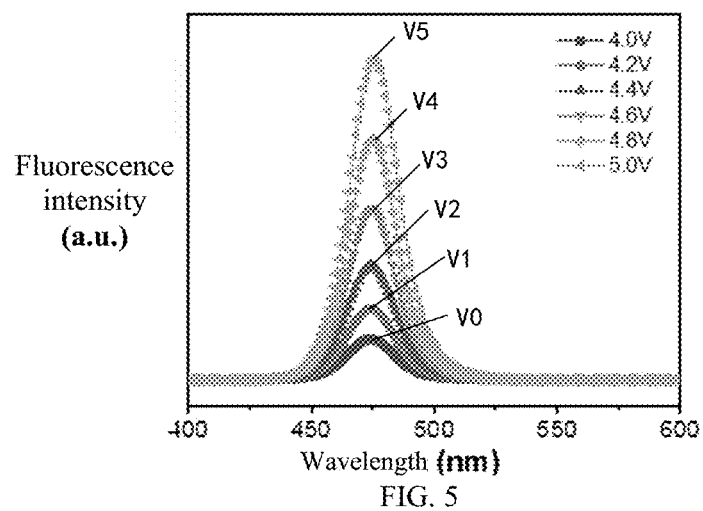
FIG. 5 illustrates electroluminescent spectra of an electroluminescent device under different voltages according to one embodiment of the disclosure.
Figure 6:
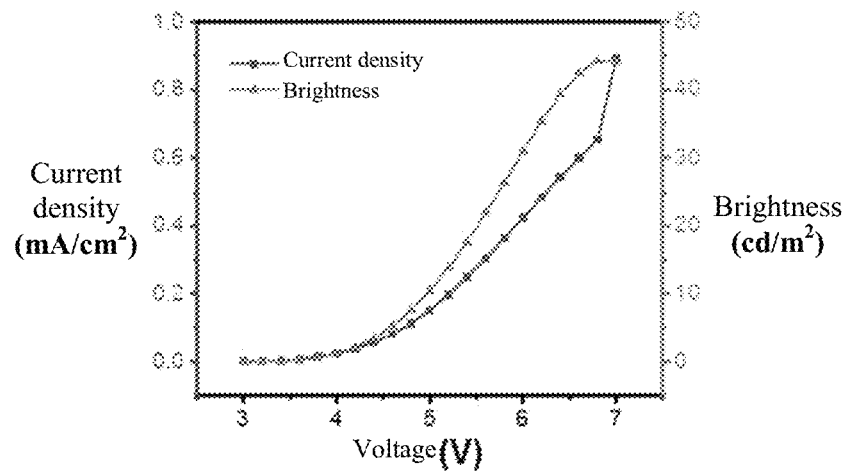
FIG. 6 illustrates variation curves of the current density and brightness of an electroluminescent device under different voltages according to one embodiment of the disclosure.
Figure 7:
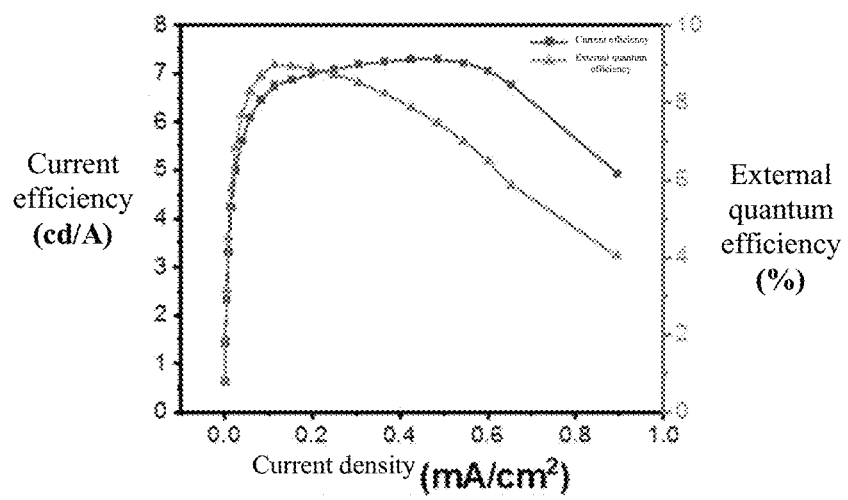
FIG. 7 illustrates variation curves of the current efficiency and external quantum efficiency of an electroluminescent device under different current densities according to one embodiment of the disclosure.

The emission spectra of the blue-light perovskite electroluminescent device formed by the preparation method are shown in FIG. 5. For the sake of a brief description, the emission spectra, obtained when the on-load voltage is 5.0V, 4.8V, 4.6V, 4.4V, 4.2V and 4.0V, are marked as V5, V4, V3, V2, V1 and V0, respectively. As can be seen from FIG. 5, with the increase of the on-load voltage of the blue-light perovskite electroluminescent device, the position of the light emitting peak remains unchanged, a small half-peak width is maintained, and a high color purity is realized, which proves that the device can be used for preparing a blue light source of high-quality displays. FIG. 6 illustrates variation curves of the current density and brightness of the blue-light perovskite electroluminescent device under different voltages. As shown in FIG. 6, with the increase of the on-load voltage, the brightness of the blue-light perovskite electroluminescent device is increased gradually, and the maximum brightness is 45 cd/m². FIG. 7 illustrates variation curves of the current efficiency and external quantum efficiency of the blue-light perovskite electroluminescent device under different current densities. As shown in FIG. 7, when the voltage of the blue-light perovskite electroluminescent device is 4.8V (as can be known according to the current density corresponding to the maximum current efficiency and FIG. 5), the current efficiency is maximized and is over 6.8 cd/A, and the corresponding external quantum efficiency is 8.9%, which reaches the international leading level, so the blue-light perovskite electroluminescent device can be used for preparing high-quality displaying devices and lighting devices. It should be noted that the molar ratio of DPPA-Br to PEA-Br of the luminescent layer in the blue-light perovskite electroluminescent device illustrated in FIG. 6 and FIG. 7 is 4:4.

One embodiment of the disclosure provides a displaying device comprising the electroluminescent device in the above embodiment.

The displaying device has the characteristics of high quality, good display effect, and good user experience. The displaying device may be a rigid displaying device or a flexible displaying device (bendable and foldable). The displaying device may be an OLED (Organic Light-Emitting Diode) displaying device, or any products or components comprising the displaying device and having a display function such as televisions, digital cameras, mobile phones, tablet personal computers, and notebook computers.

"One embodiment", "an embodiment" or "one or more embodiments" in this specification means that specific features, structures, or characteristics described in conjunction with said embodiment are included in at least one embodiment of the disclosure. In addition, it should be noted that the expression "in one embodiment" does not definitely refer to the same embodiment.

A great number of specific details are provided in this specification. However, it can be understood that the embodiments of the disclosure can be implemented even without these specific details. In some embodiments, known methods, structures and techniques are not stated in detail to ensure that the understanding of this specification will not be obscured.

The above description merely illustrates specific implementations of the disclosure, and is not intended to limit the protection scope of the disclosure. All variations or substitutions easily obtained by any skilled in the art within the technical scope of the disclosure should fall within the protection scope of the disclosure. Thus, the protection scope of the disclosure should be subject to the protection scope of the claims.

The invention claimed is:

1. A luminescent film, comprising: a crystallized blue-light perovskite material, and halogenated amine ligand materials grafted on the crystallized blue-light perovskite material;
   wherein, the crystallized blue-light perovskite material comprises 3D perovskite nano-crystals; and the halogenated amine ligand materials comprise: a first halogenated amine ligand material and a second halogenated amine ligand material, and the first halogenated amine ligand material is different from the second halogenated amine ligand material.

2. The luminescent film according to claim 1, wherein the first halogenated amine ligand material and the second halogenated amine ligand material are grafted on the crystallized blue-light perovskite material.

3. The luminescent film according to claim 1, wherein the 3D perovskite nano-crystals have a particle size of 10 nm-20 nm.

4. The luminescent film according to claim 1, wherein the blue-light perovskite material comprises a perovskite material with a molecular structure $ABX_3$, wherein A comprises any one or more of an organic amine group, formamidine and cesium ions, B comprises lead ions, and X comprises a combination of chlorine and bromine.

5. The luminescent film according to claim 4, wherein the organic amine group comprises methylamine, ethylamine, or propylamine.

6. The luminescent film according to claim 1, wherein the first halogenated amine ligand material is a brominated amine ligand material, and the second halogenated amine ligand material is an aromatic halogenated amine material.

7. The luminescent film according to claim 6, wherein:
   the brominated amine ligand material comprises any one of brominated 3,3-diphenyl propylamine, brominated ethylamine, brominated butylamine and brominated octylamine.

8. The luminescent film according to claim 6, wherein the aromatic halogenated amine material comprises any one of phenylethyl amine bromide, benzyl amine bromide, P-fluorophenyl amine bromide, O-fluorophenyl amine bromide and M-fluorophenyl amine bromide.

9. A preparation method of the luminescent film according to claim 1, comprising:
   dissolving a first blue-light perovskite reaction material, a first halogenated amine ligand material and a second halogenated amine ligand material in a first solvent to form a first precursor solution;
   dissolving a second blue-light perovskite reaction material in a second solvent to form a second precursor solution;
   stirring the first precursor solution and the second precursor solution, and mixing the two after stirring to form a blue-light perovskite precursor solution;
   forming the blue-light perovskite precursor solution on a substrate by a spin-coating process; and
   dropwise adding an anti-solvent to the blue-light perovskite precursor solution formed on the substrate within a preset time to crystallize a blue-light perovskite material, and grafting the first halogenated amine ligand material and the second halogenated amine ligand material on the crystallized blue-light perovskite material to form a blue-light luminescent film.

10. The preparation method according to claim 9, wherein the first blue-light perovskite reaction material comprises any one or more of an organic amine group, formamidine and cesium ions, and the second blue-light perovskite reaction material comprises lead ions.

11. The preparation method according to claim 10, wherein the first blue-light perovskite reaction material comprises cesium chloride, and the second blue-light perovskite reaction material comprises lead bromide.

12. The preparation method according to claim 9, wherein the first halogenated amine ligand material is a brominated amine ligand material, and the second halogenated amine ligand material is an aromatic halogenated amine material.

13. The preparation method according to claim 12, wherein the first halogenated amine ligand material comprises brominated 3,3-diphenylpropyl amine, the second halogenated amine ligand material comprises phenethyl amine bromide.

14. The preparation method according to claim 13, wherein the molar ratio of the brominated 3,3-diphenylpropyl amine to the phenethyl amine bromide is 4:4.

15. The preparation method according to claim 9, wherein the first solvent and the second solvent comprise dimethyl sulfoxide.

16. The preparation method according to claim 9, wherein the anti-solvent comprises any one of methylbenzene, chloroform, chlorobenzene, acetone and ethyl acetate.

17. An electroluminescent device, comprising an anode, a cathode, and a luminescent layer located between the anode and the cathode, wherein the luminescent layer comprises the luminescent film according to claim 1.

18. The electroluminescent device according to claim 17, further comprising a substrate disposed below the anode, a hole injection layer and a hole transporting layer disposed between the anode and the luminescent layer, and an electron injection layer and an electron transporting layer disposed between the cathode and the luminescent layer.

19. The electroluminescent device according to claim 18, wherein a preparation method of the electroluminescent device comprises:
  wiping and ultrasonically cleaning the substrate sequentially with deionized water, an acetone solution, an ethanol solution and an isopropanol solution, drying the substrate with nitrogen for use, and pre-processing the cleaned substrate with oxygen plasma to clean a surface of the substrate and improve the wettability of the surface of the substrate;
  forming the anode on the substrate;
  sequentially forming the hole injection layer and the hole transporting layer on the anode;
  forming the luminescent layer on the hole transporting layer;
  transferring the substrate into a vacuum cavity, and sequentially forming the electron transporting layer and the electron injection layer;
  forming the cathode on the electron injection layer; and
  transferring the substrate into a glove box for packaging to form the electroluminescent device.

20. A displaying device, comprising the electroluminescent device according to claim 17.

* * * * *